United States Patent
Yeh

(10) Patent No.: US 10,381,726 B1
(45) Date of Patent: Aug. 13, 2019

(54) DUAL-BAND ANTENNA

(71) Applicant: Shenzhen South Silicon Valley Microelectronics Co., Limited, Hsinchu County (TW)

(72) Inventor: Ming-Hao Yeh, Hsinchu County (TW)

(73) Assignee: Shenzhen South Silicon Valley Microelectronics Co., Limited, Hsinchu (TW)

(*) Notice: Subject to any disclaimer, the term of this patent is extended or adjusted under 35 U.S.C. 154(b) by 0 days.

(21) Appl. No.: 15/908,950

(22) Filed: Mar. 1, 2018

(51) Int. Cl.
  *H01Q 1/50* (2006.01)
  *H01Q 5/30* (2015.01)
  *H03H 7/06* (2006.01)
  *H01Q 9/04* (2006.01)

(52) U.S. Cl.
  CPC ............. *H01Q 5/30* (2015.01); *H01Q 9/0407* (2013.01); *H03H 7/06* (2013.01)

(58) Field of Classification Search
  CPC ........ H01Q 5/335; H01Q 5/50; H01Q 9/0407; H01Q 13/02; H03H 7/06
  USPC .......................... 343/850, 853, 860, 762, 700
  See application file for complete search history.

(56) References Cited

U.S. PATENT DOCUMENTS

| | | |
|---|---|---|
| 6,801,168 B1 | 10/2004 | Yeh |
| 2003/0020656 A1 | 1/2003 | Shor |
| 2004/0108957 A1 | 6/2004 | Umehara et al. |
| 2016/0134004 A1* | 5/2016 | Haluba ............... H01P 5/12 455/12.1 |

FOREIGN PATENT DOCUMENTS

TW          201044695 A1     12/2010

OTHER PUBLICATIONS

Office Action of counterpart Taiwanese Patent Application No. 107101183 dated Dec. 19, 2018.

* cited by examiner

*Primary Examiner* — Joseph J Lauture

(57) ABSTRACT

A dual-band antenna includes a first conducting path, a filter and a second conducting path. A first end of the first conducting path is connected with an antenna feed port. A first end of the filter is connected with a second end of the first conducting path. A first end of the second conducting path is connected with a second end of the filter.

8 Claims, 4 Drawing Sheets

DUAL-BAND ANTENNA

FIELD OF THE INVENTION

The present invention relates to an antenna, and more particularly to a dual-band antenna.

BACKGROUND OF THE INVENTION

FIG. 1 schematically illustrates a conventional dual-band antenna. The dual-band antenna is formed on a two-layer printed circuit board (PCB). For example, the dual-band antenna is formed on a top layer of the printed circuit board, and a metal ground surface 130 is formed on a bottom layer of the printed circuit board. Moreover, a radiation element of the dual-band antenna is formed on an antenna clearance region 110.

As shown in FIG. 1, the node A is an antenna feed port of the radiation element. The conducting path P1 extended from the node A is a high-frequency resonant path. The conducting path P2 extended from the node A is a low-frequency resonant path. The two operating frequencies of the radiation element are determined according to the lengths of the two conducting paths P1 and P2.

For example, the wavelength of the higher operating frequency is $\lambda 1$, and the wavelength of the lower operating frequency is $\lambda 2$. Consequently, the length of the conducting path P1 is equal to $(¼)\lambda 1$, and the length of the conducting path P1 is equal to $(¼)\lambda 2$.

FIG. 2 schematically illustrates a conventional coplanar waveguide dual-band antenna. The coplanar waveguide dual-band antenna, which is also referred as a CPW dual-band antenna, is formed on a single-layer printed circuit board. The radiation element of the dual-band antenna is formed on an antenna clearance region 210. Moreover, two metal ground surfaces 230a and 230b are formed on the printed circuit board. Moreover, the two metal ground surfaces 230a and 230b are located at two sides of the dual-band antenna, respectively.

As shown in FIG. 2, the node B is an antenna feed port of the radiation element. The conducting path P3 extended from the node B is a high-frequency resonant path. The conducting path P4 extended from the node B is a low-frequency resonant path.

For example, the wavelength of the higher operating frequency is $\lambda 3$, and the wavelength of the lower operating frequency is $\lambda 4$. Consequently, the length of the conducting path P3 is equal to $(¼)\lambda 3$, and the length of the conducting path P4 is equal to $(¼)\lambda 4$.

FIG. 3 schematically illustrates another conventional dual-band antenna. The dual-band antenna is disclosed in U.S. Pat. No. 6,801,168. The dual-band antenna is formed on a two-layer printed circuit board. A first radiation element of the dual-band antenna is formed on a top layer of the printed circuit board. A second radiation element and a metal ground surface 330 are formed on a bottom layer of the printed circuit board. Moreover, the first radiation element is formed on an antenna clearance region of the top layer of the printed circuit board, and the second radiation element is formed on an antenna clearance region of the bottom layer of the printed circuit board.

As shown in FIG. 3, the node C is an antenna feed port of the dual-band antenna. The conducting path P5 extended from the node C is a low-frequency resonant path. The second radiation element is contacted with the metal ground surface 330. The conducting path P6 extended from the metal ground surface 330 is a high-frequency resonant path.

FIG. 4 schematically illustrates another conventional dual-band antenna. The dual-band antenna is disclosed in US Patent Publication No. 20040108957. The dual-band antenna is formed on a two-layer printed circuit board. A first radiation element 412 and a second radiation element 414 of the dual-band antenna are formed on a top surface of the printed circuit board. Especially, the first radiation element 412 and the second radiation element 414 of the dual-band antenna are formed on an antenna clearance region of the top surface of the printed circuit board.

As shown in FIG. 4, the node D is an antenna feed port of the dual-band antenna. The conducting path P7 extended from the node D is a high-frequency resonant path. The conducting path P8 of the second radiation element 414 is a low-frequency resonant path.

SUMMARY OF THE INVENTION

An embodiment of the present invention provides a dual-band antenna. The dual-band antenna includes a first conducting path, a filter and a second conducting path. A first end of the first conducting path is connected with an antenna feed port. A first operating frequency of the dual-band antenna is determined according to a length of the first conducting path. A first end of the filter is connected with a second end of the first conducting path. A first end of the second conducting path is connected with a second end of the filter. A second operating frequency of the dual-band antenna is determined according to the first conducting path and the second conducting path. A signal with the first operating frequency is stopped by the filter. A signal with the second operating frequency is transmitted through the filter.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
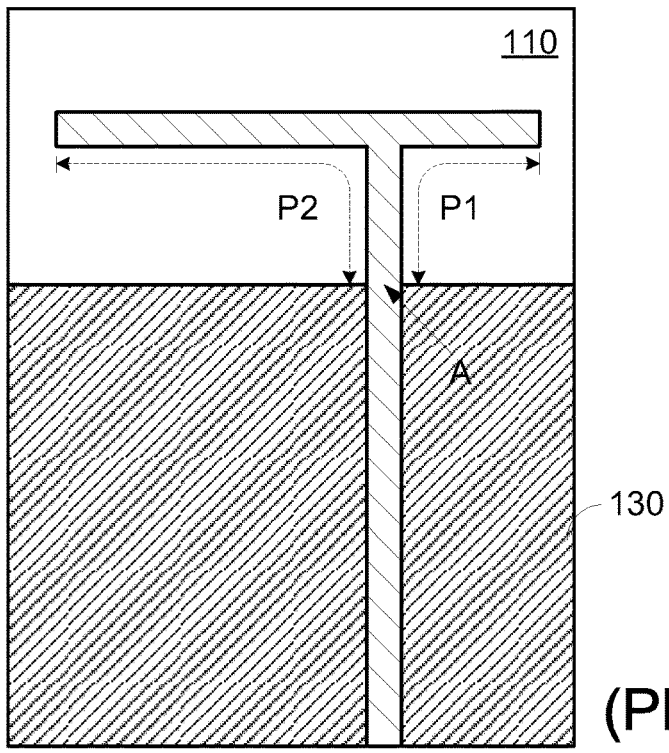
FIG. 1 (prior art) schematically illustrates a conventional dual-band antenna.
Figure 2:
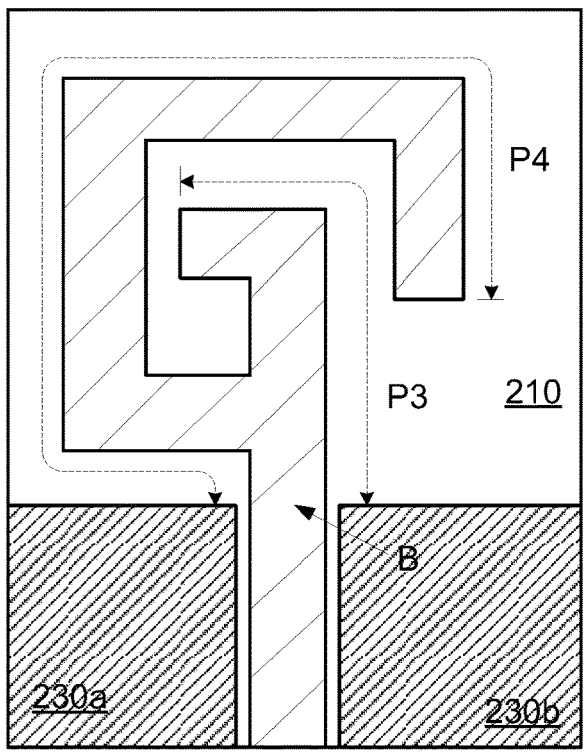
FIG. 2 (prior art) schematically illustrates a conventional coplanar waveguide dual-band antenna.
Figure 3:
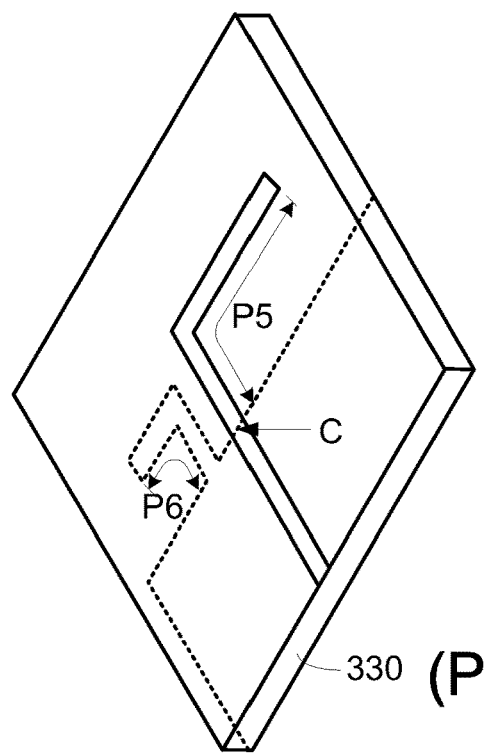
FIG. 3 (prior art) schematically illustrates another conventional dual-band antenna.
Figure 4:
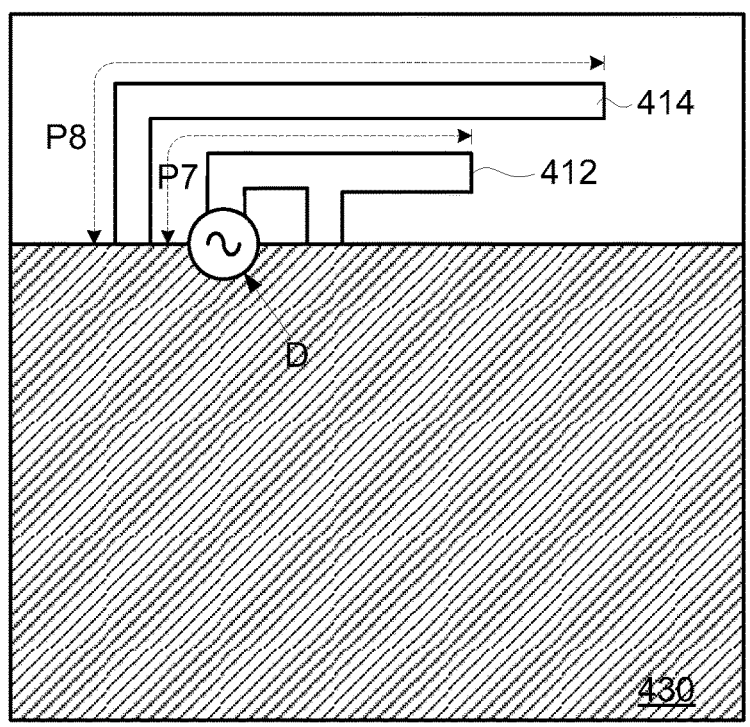
FIG. 4 (prior art) schematically illustrates another conventional dual-band antenna.
Figure 5:
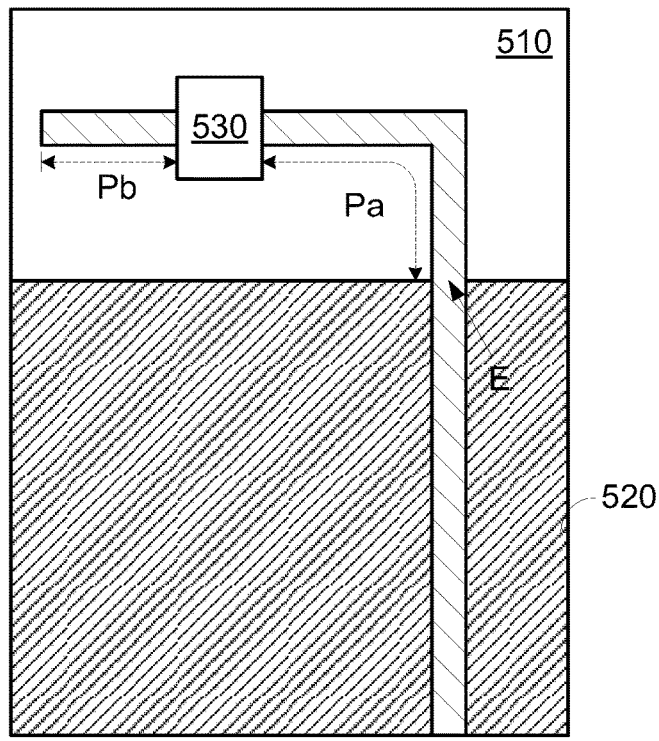
FIG. 5 schematically illustrates a dual-band antenna according to an embodiment of the present invention.

FIG. 5 schematically illustrates a dual-band antenna according to an embodiment of the present invention. The dual-band antenna is formed on a two-layer printed circuit board. For example, the dual-band antenna is formed on a top layer of the printed circuit board, and a metal ground surface 520 is formed on a bottom layer of the printed circuit board. Moreover, a radiation element of the dual-band antenna is formed on an antenna clearance region 510.

In an embodiment, a radiation element comprises a first conducting path Pa, a filter 530 and a second conducting path Pb. The filter 530 is connected between the first conducting path Pa and the second conducting path Pb.

As shown in FIG. 5, the node E is an antenna feed port of the radiation element. A first end of the first conducting path Pa is connected with the antenna feed port E. A second end of the first conducting path Pa is connected with the filter 530. Moreover, a first end of the second conducting path Pb is connected with the filter 530.

In this embodiment, the first conducting path Pa extended from the antenna feed port E is a high-frequency resonant path, and the first conducting path Pa extended from the antenna feed port E plus the second conducting path Pb is a low-frequency resonant path. Moreover, the two operating frequencies of the radiation element are determined according to the lengths of the two conducting paths Pa and Pb.

For example, the wavelength of the higher operating frequency is $\lambda a$, and the wavelength of the lower operating frequency is $\lambda b$. Consequently, the length of the high-frequency resonant path is equal to $(\frac{1}{4})\lambda a$, and the length of the low-frequency resonant path is equal to $(\frac{1}{4})\lambda b$. That is, the length of the first conducting path Pa is equal to $(\frac{1}{4})\lambda a$, and the length of the first conducting path Pa plus the second conducting path Pb is equal to $(\frac{1}{4})\lambda b$.

In accordance with a feature of the present invention, the signal with the lower operating frequency is transmitted through the filter 530, and the signal with the higher operating frequency is stopped by the filter 530. For example, a dual-band WiFi system supports the 2.4G frequency band and the 5G frequency band. In other words, the filter 530 has the 2.4G-band pass and 5G-band rejection properties.

Figure 6A:
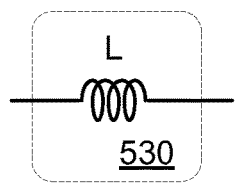
FIG. 6A is a first exemplary filter used in the dual-band antenna according to the embodiment of the present invention.

FIG. 6A is a first exemplary filter used in the dual-band antenna according to the embodiment of the present invention. The filter 530 comprises an inductor L. A first end of the inductor L is connected with the second end of the first conducting path Pa. A second end of the inductor L is connected with the first end of the second conducting path Pb. The inductance of the inductor L is in the range between 4 nH and 10 nH.

For example, the inductance of the inductor L is 6.8 nH, and the parasitic capacitance of the inductor L is 0.2 pF. Consequently, the self-resonance frequency of the inductor L is in the range between 4 GHz and 6 GHz. That is, the band stop frequency of the filter 530 is in the range between 4 GHz and 6 GHz.

For example, the inductance of the inductor L is 6.8 nH. The S11 plot (not shown) indicates that the dual-band antenna with the first exemplary inductor has the dual-frequency resonance property. However, the antenna bandwidth of the 5G operating frequency is very narrow, and the antenna efficiency of the 2.4G frequency band is low (e.g. about 40%).

Figure 6B:
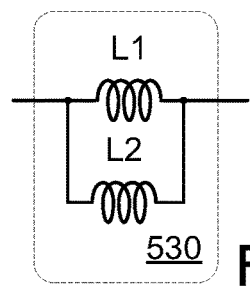
FIG. 6B is a second exemplary filter used in the dual-band antenna according to the embodiment of the present invention.

FIG. 6B is a second exemplary filter used in the dual-band antenna according to the embodiment of the present invention. The filter 530 comprises two inductors L1 and L2, which are connected with each other in parallel. A first end of the inductor L1 and a first end of the inductor L2 are connected with the second end of the first conducting path Pa. A second end of the inductor L1 and a second end of the inductor L2 are connected with the first end of the second conducting path Pb. The inductance of the inductor L is in the range between 4 nH and 10 nH.

For example, the inductance of the inductor L1 is 6.8 nH, and the inductance of the inductor L2 is 6.8 nH. The S11 plot (not shown) indicates that the dual-band antenna with the second exemplary inductor has the dual-frequency resonance property. The antenna efficiency of the 2.4G frequency band is improved. However, the antenna bandwidth of the 5G operating frequency is still narrow.

Figure 6C:
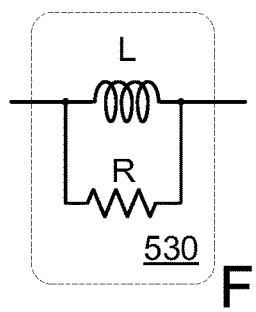
FIG. 6C is a third exemplary filter used in the dual-band antenna according to the embodiment of the present invention.

FIG. 6C is a third exemplary filter used in the dual-band antenna according to the embodiment of the present invention. The filter 530 comprises an inductor L and a resistor R which are connected with each other in parallel. A first end of the inductor L and a first end of the resistor R are connected with the second end of the first conducting path Pa. A second end of the inductor L and a second end of the resistor R are connected with the first end of the second conducting path Pb. The inductance of the inductor L is in the range between 4 nH and 10 nH. The resistance of the resistor R is in the range between 400 ohms and 2000 ohms.

For example, the inductance of the inductor L is 6.8 nH, and the resistance of the resistor R is 650 ohms. The S11 plot (not shown) indicates that the dual-band antenna with the third exemplary inductor has the dual-frequency resonance property. The antenna bandwidth of the 5G operating frequency is widened. However, the antenna efficiency of the 2.4G frequency band is low (e.g. about 40%).

Figure 6D:
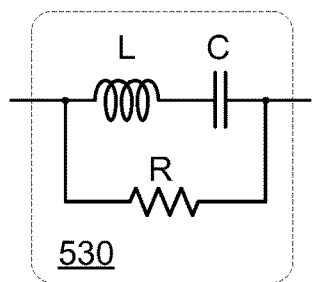
FIG. 6D is a fourth exemplary filter used in the dual-band antenna according to the embodiment of the present invention.

FIG. 6D is a fourth exemplary filter used in the dual-band antenna according to the embodiment of the present invention. The filter 530 comprises an inductor L, a capacitor C and a resistor R. A first end of the inductor L is connected with the second end of the first conducting path Pa. A second end of the inductor L is connected with a first end of the capacitor C. A second end of the capacitor C is connected with the first end of the second conducting path Pb. A first end of the resistor R is connected with the second end of the first conducting path Pa. A second end of the resistor R is connected with the first end of the second conducting path Pb. The inductance of the inductor L is in the range between 4 nH and 10 nH. The resistance of the resistor R is in the range between 400 ohms and 2000 ohms. The capacitance of the capacitor C is in the range between 0.1 pF and 2 pF.

For example, the inductance of the inductor L is 6.2 nH, the resistance of the resistor R is 560 ohms, and the capacitance of the capacitor C is 0.5 F. The S11 plot (see FIG. 7) indicates that the dual-band antenna with the fourth exemplary inductor has the dual-frequency resonance property. The antenna bandwidth of the 5G operating frequency is widened. The antenna efficiency of the 2.4G frequency band is improved (e.g. about 80%). The antenna efficiency of the 5G frequency band is about 50%.

Figure 6E:
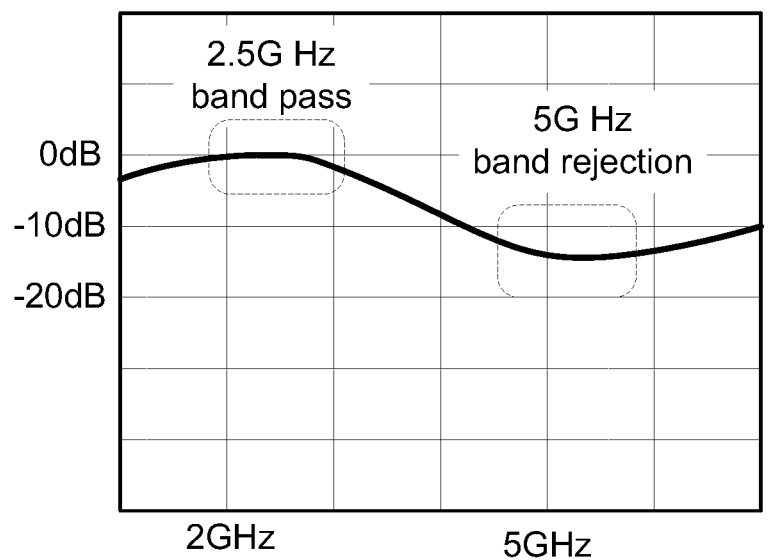
FIG. 6E is an S21 plot of the fourth exemplary filter used in the dual-band antenna according to the embodiment of the present invention.

FIG. 6E is an S21 plot of the fourth exemplary filter used in the dual-band antenna according to the embodiment of the present invention. As shown in FIG. 6E, the S21 coefficient of the filter 530 in the 2.4G frequency band is about 0.2 dB. That is, the filter 530 has the 2.4G-band pass property. Moreover, the S21 coefficient of the filter 530 in the 5G frequency band is about −15 dB. That is, the filter 530 has the 5G-band rejection property.

Figure 7:
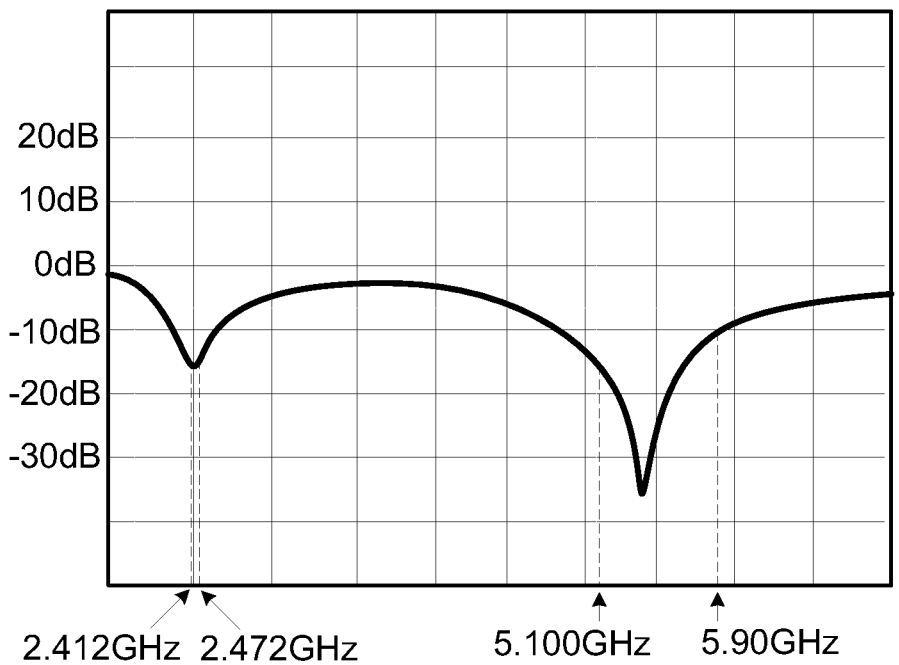
FIG. 7 is an S11 plot of the fourth exemplary filter used in the dual-band antenna according to the embodiment of the present invention.

FIG. 7 is an S11 plot of the fourth exemplary filter used in the dual-band antenna according to the embodiment of the present invention. The S11 coefficient at the frequency of 2.412 GHz is −14.884 dB. The S11 coefficient at the frequency of 2.472 GHz is −14.506 dB. The S11 coefficient at the frequency of 5.10 GHz is −15.628 dB. The S11 coefficient at the frequency of 5.90 GHz is −10.230 dB.

From the above descriptions, the dual-band antenna of the present invention is applied to the 2.4G frequency band and the 5G frequency band of a dual-band WiFi system.

In the above embodiment, the dual-band antenna of the present invention is applied to the dual-band WiFi system. However, the applications of the dual-band antenna are not restricted. It is noted that numerous modifications and alterations may be made while retaining the teachings of the invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A dual-band antenna, comprising:
    a first conducting path, wherein a first end of the first conducting path is connected with an antenna feed port, and a first operating frequency of the dual-band antenna is determined according to a length of the first conducting path;
    a filter, wherein a first end of the filter is connected with a second end of the first conducting path; and
    a second conducting path, wherein a first end of the second conducting path is connected with a second end of the filter, and a second operating frequency of the dual-band antenna is determined according to the first conducting path and the second conducting path,
    wherein a signal with the first operating frequency is stopped by the filter, and a signal with the second operating frequency is transmitted through the filter.

2. The dual-band antenna as claimed in claim 1, wherein the filter comprises a first inductor, wherein a first end of the first inductor is connected with the second end of the first conducting path, and a second end of the first inductor is connected with the first end of the second conducting path.

3. The dual-band antenna as claimed in claim 2, wherein the filter further comprises a second inductor, wherein a first end of the second inductor is connected with the second end of the first conducting path, and a second end of the second inductor is connected with the first end of the second conducting path.

4. The dual-band antenna as claimed in claim 3, wherein an inductance of the first inductor is in a range between 4 nH and 10 nH, and an inductance of the second inductor is in a range between 4 nH and 10 nH.

5. The dual-band antenna as claimed in claim 2, wherein the filter further comprises a resistor, wherein a first end of the resistor is connected with the second end of the first conducting path, and a second end of the resistor is connected with the first end of the second conducting path.

6. The dual-band antenna as claimed in claim 5, wherein an inductance of the first inductor is in a range between 4 nH and 10 nH, and a resistance of the resistor is in a range between 400 ohms and 2000 ohms.

7. The dual-band antenna as claimed in claim 1, wherein the filter comprises:
    an inductor;
    a capacitor, wherein the capacitor and the inductor are connected with each other in series and connected between the second end of the first conducting path and the first end of the second conducting path; and
    a resistor, wherein a first end of the resistor is connected with the second end of the first conducting path, and a second end of the resistor is connected with the first end of the second conducting path.

8. The dual-band antenna as claimed in claim 7, wherein an inductance of the first inductor is in a range between 4 nH and 10 nH, a resistance of the resistor is in a range between 400 ohms and 2000 ohms, and a capacitance of the capacitor is in a range between 0.1 pF and 2 pF.

* * * * *